United States Patent [19]

Hashemi et al.

[11] Patent Number: 5,403,784

[45] Date of Patent: Apr. 4, 1995

[54] PROCESS FOR MANUFACTURING A STACKED MULTIPLE LEADFRAME SEMICONDUCTOR PACKAGE USING AN ALIGNMENT TEMPLATE

[75] Inventors: Seyed H. Hashemi; Michael A. Olla, both of Austin; John C. Parker, Round Rock, all of Tex.

[73] Assignee: Microelectronics and Computer Technology Corporation, Austin, Tex.

[21] Appl. No.: 8,044

[22] Filed: Jan. 29, 1993

Related U.S. Application Data

[63] Continuation of Ser. No. 753,457, Sep. 3, 1991, abandoned.

[51] Int. Cl.⁶ ................... H01L 21/58; H01L 21/60; H01L 21/52; H01L 21/56
[52] U.S. Cl. ............................. 437/217; 437/220; 437/915
[58] Field of Search ............... 361/770, 773, 790, 804, 361/807, 813, 820

[56] References Cited

U.S. PATENT DOCUMENTS

| | | | |
|---|---|---|---|
| 2,898,520 | 2/1956 | Sterner | 361/773 |
| 3,501,598 | 3/1970 | Lis | 361/773 |
| 3,673,309 | 6/1972 | Dalmasso et al. | 361/813 |
| 3,930,114 | 12/1975 | Hodge | 437/902 |
| 4,382,327 | 5/1983 | Bardens et al. | 437/221 |
| 4,427,992 | 1/1984 | Ritchie et al. | 437/218 |
| 4,677,526 | 6/1987 | Muehling | 361/421 |
| 4,680,617 | 7/1987 | Ross | 357/70 |
| 4,801,765 | 1/1989 | Moyer et al. | 29/827 |
| 5,099,306 | 3/1992 | Dunaway et al. | 357/70 |

FOREIGN PATENT DOCUMENTS

| | | | |
|---|---|---|---|
| 1292861 | 6/1961 | France | 361/405 |
| 0240628 | 11/1986 | Germany | 437/218 |
| 55-115339 | 9/1980 | Japan | 437/220 |

OTHER PUBLICATIONS

Stys et al., "A Study of Electrical Performance for Next Generation Plastic Packages," IEEE-CHMT 41st Conference, May, 1991, pp. 278-282.

Quint et al., "Measurements of R,L, and C Parameters in VLSI Packages," Hewlett-Packard Journal, Oct. 1990, p. 73.

Choksi et al., "Computer Aided Electrical Modeling of VLSI Packages," Electronic Components and Technology Conference, 1990, pp. 169-170.

*Primary Examiner*—Olik Chaudhuri
*Assistant Examiner*—David E. Graybill
*Attorney, Agent, or Firm*—Fulbright & Jaworski

[57] ABSTRACT

A process for manufacturing a pin grid array package providing a plurality of electrical input and/or output connections using a plurality of stacked, but spaced apart, separate leadframes which are preformed and include a plurality of electrical leads having first and second ends for providing a plurality of different connections. An insulating layer is positioned between adjacent leadframes and the package is bonded together.

23 Claims, 9 Drawing Sheets

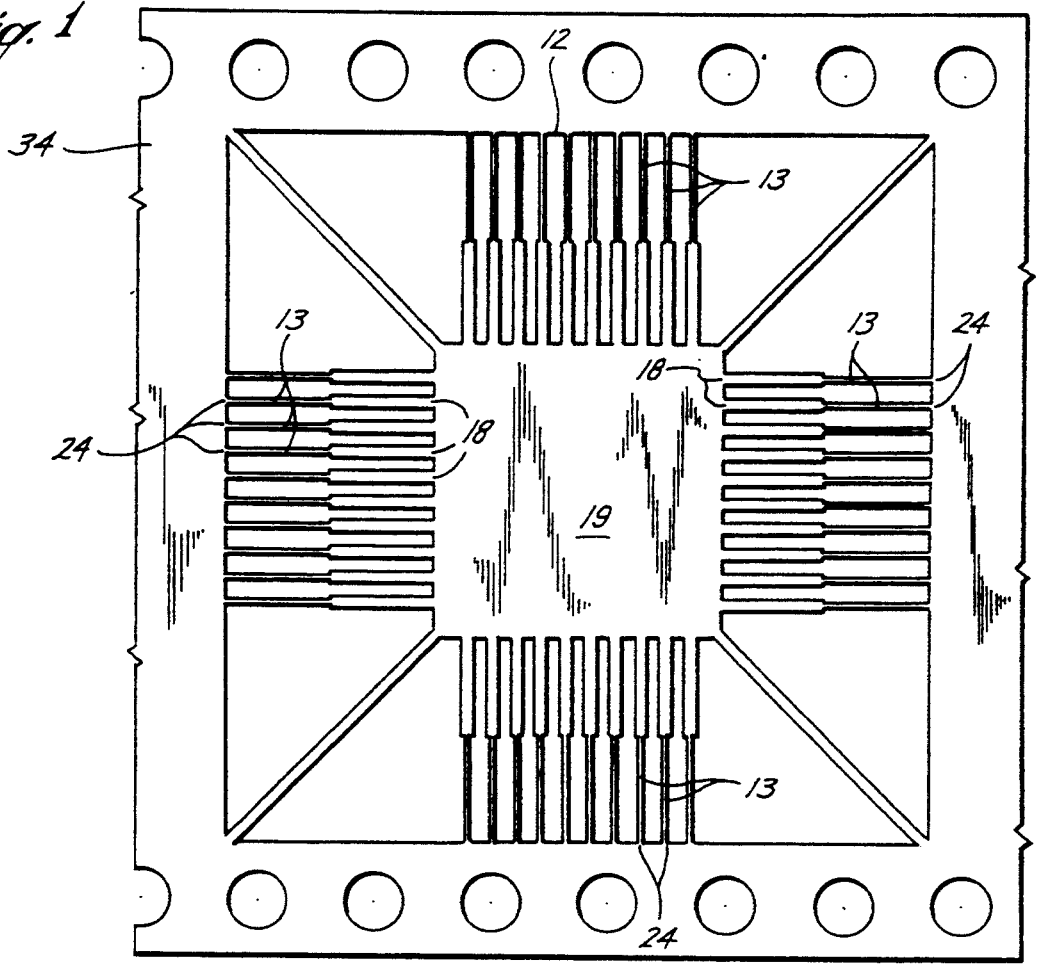
Fig. 1
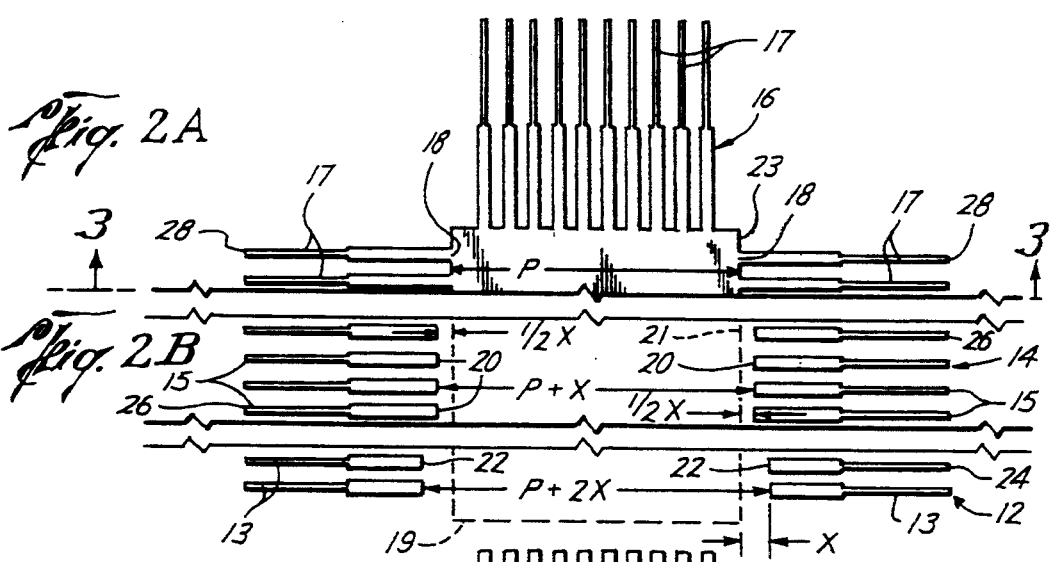
Fig. 2A
Fig. 2B
Fig. 2C

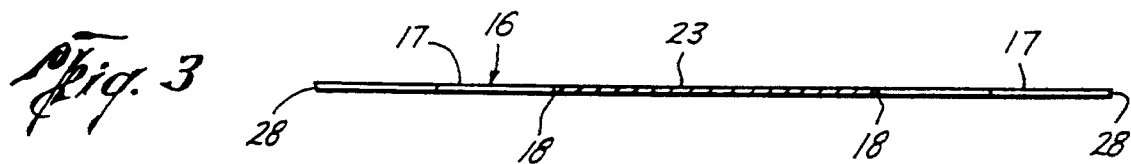
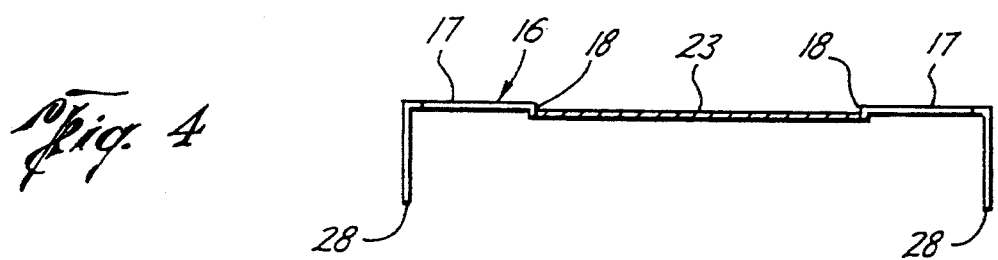
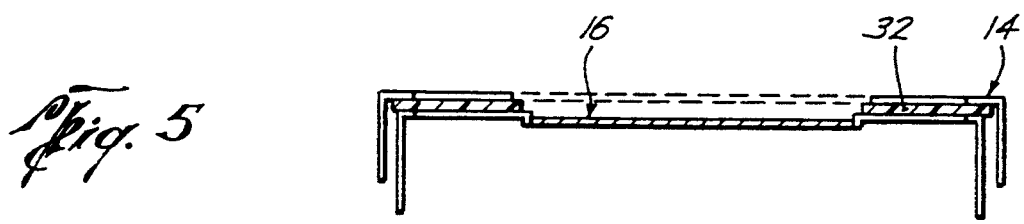
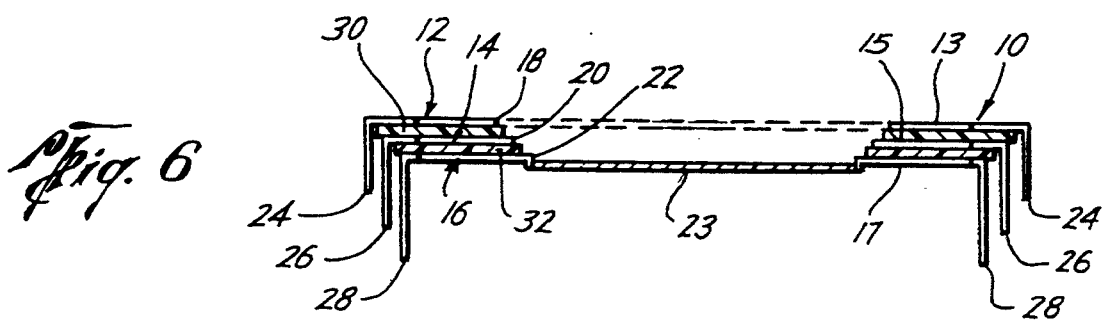
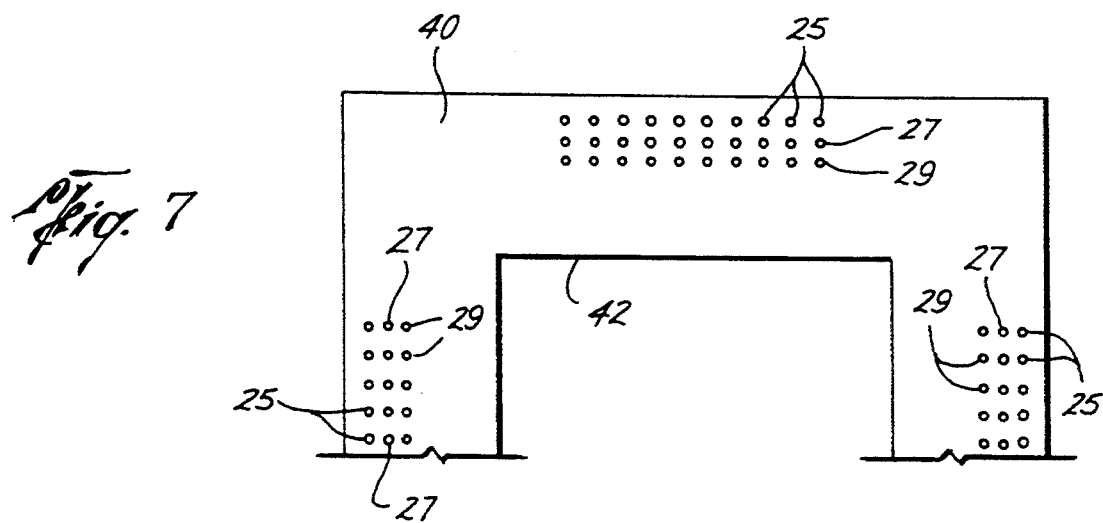

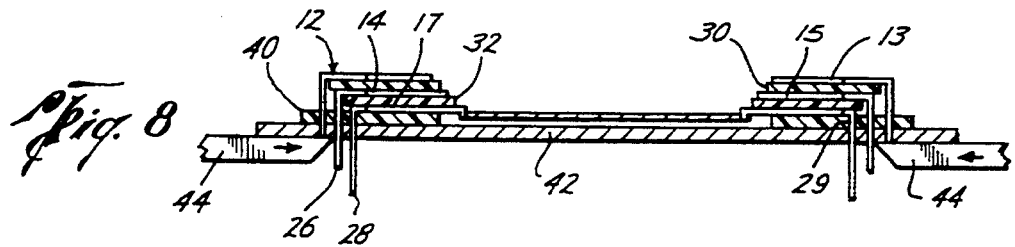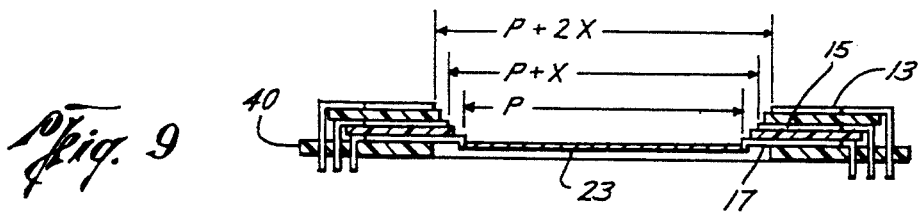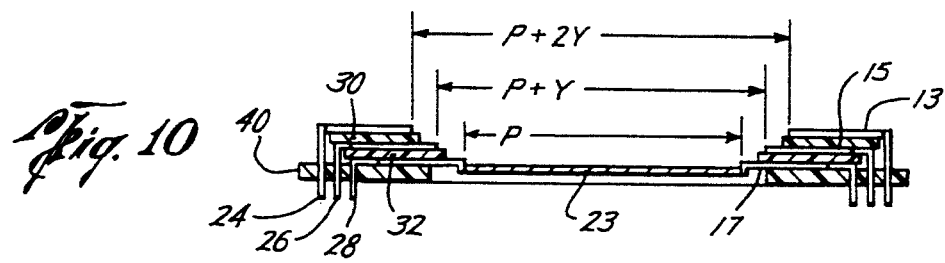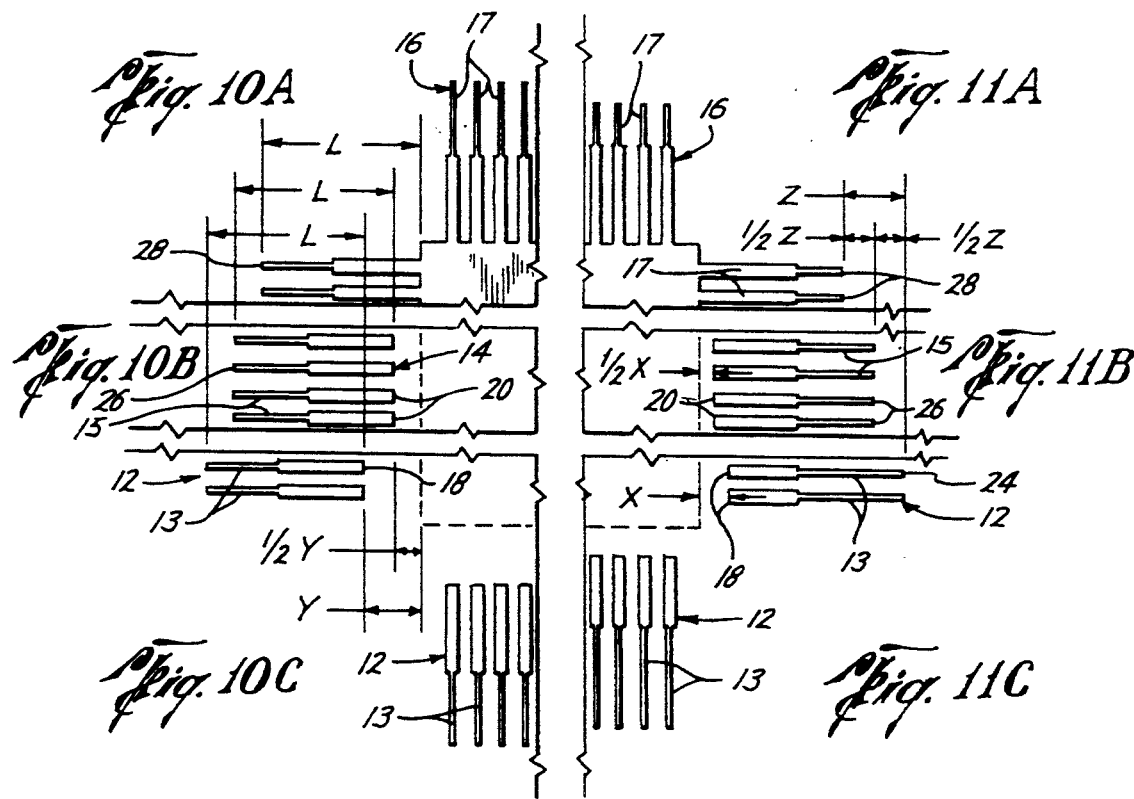

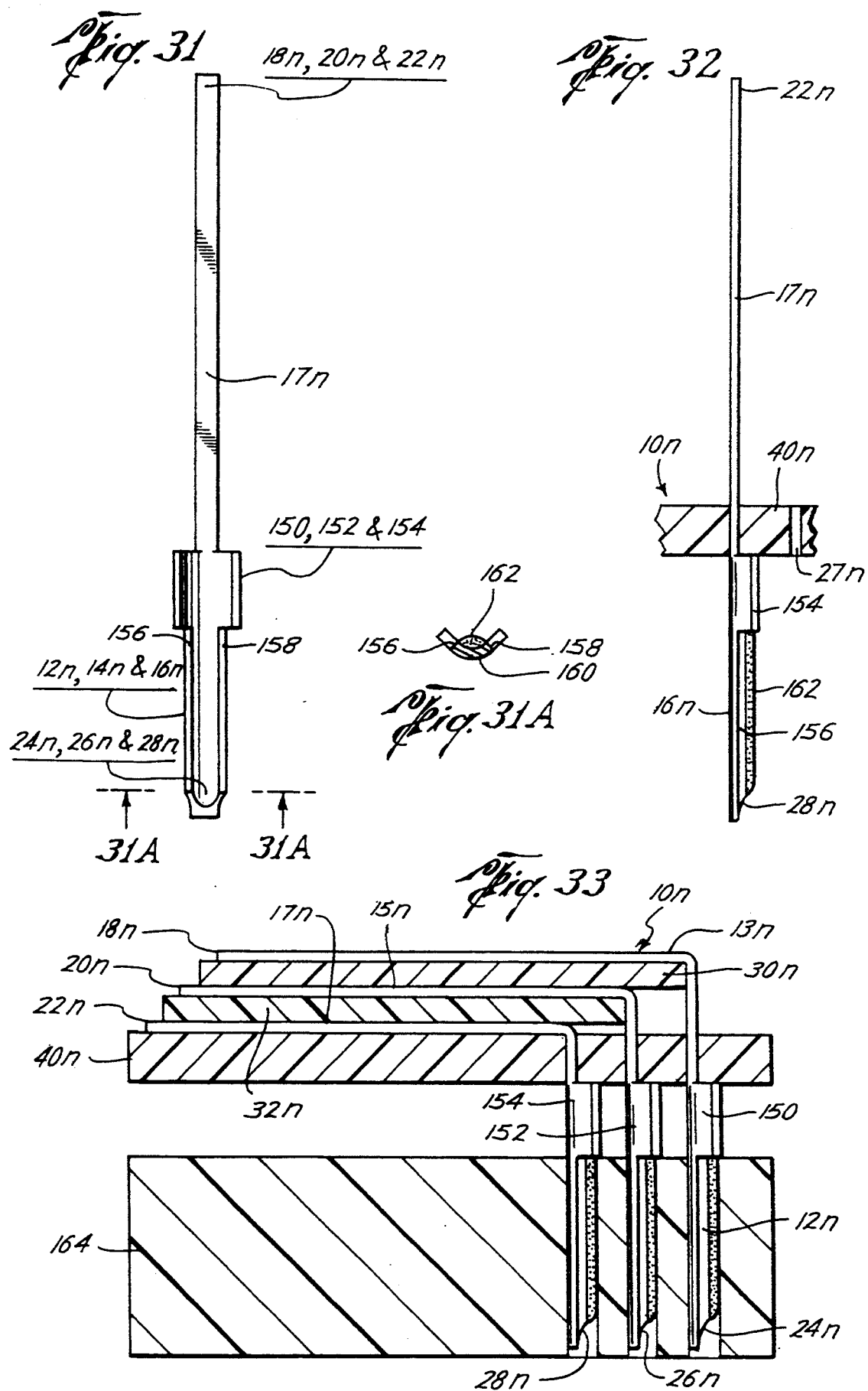

PROCESS FOR MANUFACTURING A STACKED MULTIPLE LEADFRAME SEMICONDUCTOR PACKAGE USING AN ALIGNMENT TEMPLATE

This application is a continuation of application Ser. No. 07/753,457, filed Sep. 3, 1991, now abandoned.

BACKGROUND OF THE INVENTION

Presently, pin grid array (PGA) packages are utilized for providing high pin count devices with electrical inputs/outputs. Multilayer ceramic or plastic PGA packages are expensive and at the present time cost approximately 10–12 cents per pin or 5–6 cents per pin, respectively. Each pin requires an individual brazing point for external pins on the package body. Plastic PGA's are significantly limited by thermal issues.

The present invention is directed to a low cost pin grid array carrier that is similar to a PGA package, but with cost improvements of five to ten times over present packages and with at least similar or better performance. The present invention utilizes standard leadframes which are preformed, stacked and partly recessed. Bonded insulating adhesive layers applied between each of the leadframes supply support. The preformed leadframes are positioned such that the leads from each leadframe are 50 or 100 mils apart, similar to a standard PGA footprint. Variation of the standard package can be provided with a cavity-down or a cavity-up package by maintaining the die paddle only on the top or bottom leadframe, respectively. The die paddles from other leadframes used in the stacks are punched out. A single chip, or a multichip module can be packaged. The package is not restricted to a single chip since an interconnect substrate with a plurality of chips can be placed in the package cavity. If desired, the package can be connected to a heat sink and the package may be designed to be hermetically sealed, or simply environmentally protected.

SUMMARY

The present invention is directed to a stacked leadframe array package providing a plurality of electrical input and/or output connections and includes a plurality of stacked, but spaced apart, leadframes. Each leadframe has a plurality of electrical leads having first and second ends for providing a plurality of different electrical connections and for providing mechanical integrity. An insulating layer is positioned between adjacent leadframes for insulating the leads of adjacent leadframes from each other. Preferably, the stacked leadframes and insulation layers are bonded together.

Still a further object of the present invention is wherein the first ends and the second ends of each of the leadframes terminate in parallel, but spaced planes from the first ends and the second ends, respectively, of the other leadframes.

Yet a still further object of the present invention is wherein the first ends of the leads of each successive leadframe has a sequentially different length.

Still a further object is wherein the second ends of each leadframe terminates in a single plane for ease of connection.

Yet a still further object of the present invention is the provision of a template having a plurality of spaced openings for receiving and aligning the second ends of the leads.

Still a further object is the provision of a ground plane positioned between two adjacent leadframes and insulated therefrom.

Another object of the present invention is wherein the insulating layer includes a castellated seal ring having a plurality of channels, each of which receives a lead.

A still further object of the present invention is the provision of a plastic ring positioned on one end of the package with a metal heat spreader attached to the ring, and a die paddle connected to the heat spreader and adapted to receive an electrical component. In one embodiment, a circuit die is connected to the die paddle adjacent to and connected to the first ends of the leads, and a heat sink is connected to the side of the heat spreader opposite the die paddle.

In another embodiment, an interconnect board is connected to the die paddle adjacent to and connected to the first ends of the leads, and at least one integrated circuit die is connected to the interconnect.

Still a further object of the present invention is wherein the first and second ends of each lead are bent to be approximately perpendicular to each other.

Still a further object of the present invention is the method of making a stacked leadframe array package by stacking a plurality of preformed leadframes separated by an insulating layer between adjacent leadframes. Each leadframe includes a die paddle and has a plurality of electrical leads having first and second ends for providing a plurality of different electrical connections. The method includes bonding the stack of leadframes and insulating layers together.

Still a further object is the method of trimming the second ends of the leads so that the leads of each successive leadframe layer has a sequentially different length.

Still a further object is the method of placing the second ends of all the leadframes in a single plane.

Another object includes the step of bending the leads whereby the first and second ends of each lead are approximately perpendicular to each other.

A further object is the method of using a template having a plurality of spaced openings for receiving and aligning the second ends of the leads for performing the stacking step. The method includes starting with the lowest leadframe and inserting the second ends thereof through the openings in the colander, and continuing to insert second ends of successive upper layers of leadframes into openings in the between insulating layers.

A still further object is the provision of a method of removing all of the die paddles except one at the end of the stack. Thereafter, in one embodiment the method includes progressively shortening the length of the first ends of the leads in successive layers away from the retained die paddle and in another embodiment includes progressively shortening the length of the first ends in successive layers toward the retained die paddle.

Still a further method of the present invention is attaching an electrical component to the retained die paddle and electrically connecting the first ends to the electrical component. The method of the present invention may also include placing a heat sink against the die paddle on the side opposite the electrical component and/or hermetically enclosing the electrical component and first ends.

Still a further object of the present invention is wherein the insulating layer is a castellated seal ring having a plurality of channels and includes the step of inserting each of the leads into a separate channel.

Other and further objects, features and advantages will be apparent from the following description of presently preferred embodiments of the invention, given for the purpose of disclosure and taken in conjunction with the accompanying drawings.

BRIEF DESCRIPTION OF THE DRAWINGS

FIG. 1 is an elevational view of one type of leadframe shown in a portion of a tape, FIG. 2A is a fragmentary, elevational view of a leadframe which has been trimmed for the bottom position when stacked, FIG. 2B is a fragmentary, elevational view of a leadframe which has been trimmed for a midposition when stacked, FIG. 2C is a fragmentary, elevational view of a leadframe which has been trimmed for a top position when stacked, FIG. 3 is a cross-sectional view taken along the line 3—3 of FIG. 2A, FIG. 4 is a view similar to FIG. 3 with the leads bent, FIG. 5 is a cross-sectional view similar to FIG. 4 with the addition of the lead frame of FIG. 2B stacked with insulation therebetween, FIG. 6 is the next step in the method of making the present invention and is a cross-sectional view similar to FIG. 5 with the addition of the leadframe of FIG. 2C bent and stacked with insulation, FIG. 7 is a fragmentary, elevational view of a colander aligner, FIG. 8 is a cross section of FIG. 6 with the bent leads inserted through a template aligner and including means for trimming the second ends of the leads, FIG. 9 is a view similar to FIG. 8 with the trimming means removed, FIG. 10 is a cross section of a stacked leadframe array with all of the leads trimmed to the same length, but with the lower and upper leads moved outwardly, so that the second bent ends will be of the same length, FIG. 10A is a fragmentary, elevational view of the trimmed first end leads of FIG. 10, FIG. 10B is a fragmentary, elevational view of the trimmed and outwardly moved mid-leads of FIG. 10, FIG. 10C is a fragmentary, elevational view of the trimmed and outwardly moved upper leads of FIG. 10, FIG. 11A is a fragmentary, elevational view of the trimmed lower leadframe ends cut for use in FIG. 9, FIG. 11B is a fragmentary, elevational view of the trimmed mid-lead frame leads with the ends cut for use in FIG. 9, FIG. 11C is a fragmentary, elevational view of the trimmed upper leadframe leads for use in FIG. 9, FIG. 31 shows top plan view of leads containing a standoff which are roll formed from the standoff to an exterior tip, FIG. 31A is a cross-sectional view taken along line 31A—31A of FIG. 31, FIG. 32 is a cross-sectional view of the leads of FIG. 31 with the first ends inserted through the template, and FIG. 33 is a cross-sectional view of the completed assembly following FIG. 32.

DESCRIPTION OF THE PREFERRED EMBODIMENT

Figure 12:
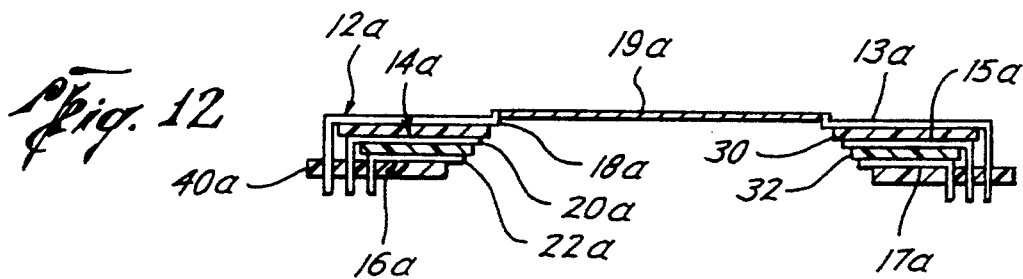
FIG. 12 is a cross-sectional view similar to FIG. 9, but assembled with the cavity down.

Referring now to the drawings, and particularly to FIG. 6, the reference numeral 10 generally indicates one type of stacked leadframe array package which provides a plurality of electrical input and/or output connections. The package 10, for purposes of illustration only, provides a plurality of stacked, but spaced apart, leadframes 12, 14, and 16. While three leadframes are shown for convenience, any desirable number may be provided depending upon the number of inputs and outputs desired. Each leadframe includes a plurality of electrical leads and thus the leadframe 12 includes a plurality of leads 13, the leadframe 14 includes a plurality of leads 15, and the leadframe 16 includes a plurality of leads 17. Each of the electrical leads 13, 15 and 17 includes first ends 18, 20, and 22, respectively, and includes second ends 24, 26, and 28, respectively. An insulating layer is positioned between adjacent leadframes for insulating the leads of adjacent leadframes from each other. Therefore, insulating layer 30 is provided between leadframes 12 and 14, and insulating layer 32 is provided between leadframes 14 and 16. The present package 10, by using standard leadframes in which the leads from each leadframe are 50 or 100 mils apart, that is a standard PGA footprint, and using an inexpensive adhesive insulating material, forms a stacked multi-shelf package that is many times less costly than the present PGA packages, yet provides similar or better performance.

Various typical and conventional leadframes may be utilized to form part of the array package 10. While straight fan-out leads are depicted herein, leads which fan-out in a radial pattern as is common in the art are encompassed within the present invention. For example, referring to FIG. 1, a continuous tape 34 having a plurality of leadframes is shown such as having a leadframe 12 which includes a plurality of straight leads 13 having first ends 18 and second ends 24, and a conventional die paddle 19 connected to the first ends 18 of the leads 13.

While the leads 13 of leadframe 12 may, in some cases, be merely separated from the continuous tape 34, and stacked over other similar leadframes, it may be desirable to slightly alter certain leadframes to provide other desired attributes. For example, referring to FIG. 6, first ends 18, 20 and 22 of the leadframes 12, 14 and 16 are positioned so that the first ends of each successive leadframe have a sequentially different length. The reason for this difference in the length of the first ends is for ease in electrically connecting the first ends to an electrical component to be included in the package 10 as will be more fully discussed hereinafter. Also, while the second ends 24, 26 and 28 of the leadframes 12, 14 and 16, respectively, are shown as having different lengths, this may be undesirable in many applications. That is, for ease of connection of the second ends 24, 26 and 28 to certain types of interconnects, all of the second ends 24, 26 and 28 should be of the same length, as will be more fully discussed hereinafter.

Referring now to FIGS. 2A, 2B and 2C, one method of trimming the leadframes 16, 14 and 12, respectively, is best seen. In FIG. 2A, the leadframe 16 remains connected to its die paddle 23 and the leads 17 are not trimmed, and it is noted that the first ends 18 of the leads 17 remain spaced at a distance of "P" which is the width of the die paddle 23.

Referring now to FIG. 2B, the die paddle 21 (shown in dotted outline) of the leadframe 14 is removed, and the first ends 20 of the leads 15 are trimmed a distance ½ X, which may be any predetermined distance to provide an offset of the first ends 20 of the leads 15 relative to the first ends 18 and 22 of the leadframes 12 and 16, respectively.

In FIG. 2C, the die paddle 19 (FIG. 1) has been removed and the first ends 22 of the leads 13 have been trimmed a distance of X to provide an offset of the first ends 22 from the first ends 20 of the leadframe 14.

Referring now to FIG. 3, a cross-sectional view of the leadframe 16 in elevation is shown. In FIG. 4, the leads 17 are bent by any suitable means so as to place the first ends 18 generally perpendicular to the second ends 28, and the die paddle 23 may be depressed if desired. Thus, in FIG. 4, the leadframe 16 is in condition for stacking and receiving successive layers of insulation and other preformed leadframes.

Referring to FIG. 5, the next step in the method of manufacturing the package 10 is to apply an insulating layer 32 over the leadframe 16. The insulation 32 may be any suitable insulation, such as polyimide, and preferably a suitable adhesive. However, the insulation 32 can be thermal setting novalac or anhydride epoxies common in the manufacture of semiconductor packages. Another suitable insulating material would be a thermal plastic which can be injection molded such as PPS (Ryton) polyphelonene sulphide, PEEK, polyether ether ketone, PES or polyester sulfone. The thermal plastics can be chemically or ultrasonically welded for bonding, but the thermal-setting plastics must be bonded together such as by epoxy. Thereafter, the bent next leadframe layer 14 is stacked over the insulation 32.

And in FIG. 6, the three layer package 10 is further stacked with the addition of the insulation layer 30 and the leadframe 12. While any suitable method of stacking the leadframes 16, 14 and 18 may be provided, one desirable method is by the use, as best seen in FIG. 7, of a template 40 which may or may not have an opening 42 depending upon the application. The template is constructed from a non-conductive material, preferably with a TCE compatible with that of package 10. The template 40 includes a plurality of rows of openings 29 for receiving the second ends 28 of the leadframe 16, a plurality or rows of openings 27 for receiving the second ends 26 of the leadframe 14, and a plurality of rows of openings 25 for receiving the second ends 24 of the leadframe 12. Openings 25, 27 and 29 may be punched or laser drilled holes. Although not shown, the template may include one or more power planes therein to provide a voltage plane and/or ground plane for the leads.

Thus, as best seen in FIG. 8, the template 40 may easily be used for aligning, supporting, and building up the package 10. The second ends 28 of the leads 17 of leadframe 16 are inserted into the openings 29, the layer of insulation 32 is added, the second ends 26 of the leads 15 of the leadframe 14 are inserted through the openings 27 in template 40, the insulation layer 30 is added, and the second ends 24 of leads 13 of the leadframe 12 are inserted through the openings 25 to complete the package 10. As previously mentioned, it is desired that all of the second ends 24, 26 and 28, in some applications, be positioned in the same X plane. As best seen in FIG. 8, a die plate 42 having openings aligned with the second ends 24, 26 and 28 is provided under package 10. Second lead ends 24, 26 and 28 are inserted through the die plate openings and protrude beneath die plate 42. Underneath die plate 42, inwardly moving knives 44 trim and cut second ends 24, 26 and 28 to assure they are of equal length. Thereafter, as best seen in FIG. 9, the die paddle 42 is removed and the array package 10 is completed. If desired, the template 40 may also be removed. For example, template 40 may be made of a chemically soluble material and washed away prior to molding. However, it may also become a permanent part of the package 10, as it can hold, align and position the second ends of the preformed leadframes as well as assist during the layering or stacking operation. Furthermore, if the second lead ends 24, 26 and 28 are trimmed short enough, the lead tips protruding below the bottom surface of package 10 may be referred to as pads rather than pins.

Of course, other methods of trimming the leadframes may be provided. FIGS. 10A, 10B and 10C describe a method of trimming all of the leads to the same length. And FIGS. 11A, 11B and 11C disclose another embodiment of trimming to provide the structure of FIG. 9.

FIGS. 10, 10A, 10B and 10C disclose a method of trimming of all of the leads to the same length, but with the mid-leadframe 14 and the leads of the top leadframe 12 moved outwardly so that the bent second ends will all be of the same length under the template 40. In FIGS. 10, 10A, 10B and 10C, it is noted that all of the leads 17, 15 and 13 have been trimmed to the same length "L" as indicated by in the case of leadframe 16 cutting the second ends 28 a distance Y, and in the case of the leadframe 14 cutting both the first ends 20 and the second ends 26 of leads 15 a distance of ½ Y, and in the case of leadframe 12 cutting the first ends 18 of the leads 13 a distance Y. By proper bending, the template 40 may again be used, but the ends 24, 26 and 28 will not need to be again cut as required in FIG. 8 to place all the second ends in the same X plane.

Referring to FIG. 11A, 11b and 11C, the method for trimming the leads for assembly and providing the structure in FIG. 9 is best seen. Thus, in FIG. 11A, the leadframe 16 has the second ends 28 of the leads 17 trimmed a distance of Z, which equals the distance from the second end 28 to the second end 24. In the leadframe 14, the first ends 20 are trimmed a distance of ½ X and the second ends 26 are trimmed a distance of X, and in the leadframe 12, the first ends 18 are trimmed a distance of ½ Z. Thus, when the leadframes 16, 14 and 12 are stacked as in FIG. 9, they will provide the structure without the need of the knives in FIG. 8.

Other and further embodiments of the present invention may be provided wherein like parts to those shown in FIGS. 1-11 will be similarly numbered with the addition of suffixes. Referring now to FIG. 12, an embodiment is shown which is stacked and packaged with the cavity facing downwardly as distinguished from the embodiment of FIG. 9 wherein the cavity faces upwardly. In this embodiment, the paddle die 19a of the top leadframe 12a remains in place for receiving and supporting another packaged structure and the remainder of the paddle dies in the leadframes 14a and 16a are removed. Again, the first ends 18a, 20a and 22a of the leads 13a, 15a and 17a have sequentially different lengths which become shorter in successive leadframe layers away from the die paddle 19a.

Figure 13:
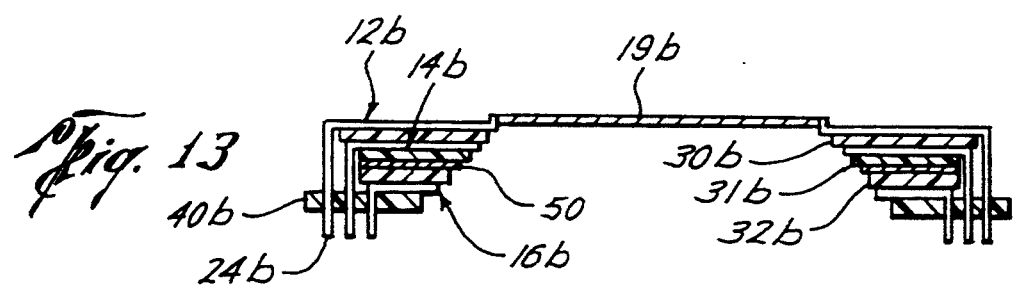
FIG. 13 is a cross-sectional view similar to FIG. 12, but with the addition of a ground plane.

Referring now to FIG. 13, another embodiment is shown which is similar to FIG. 12, but with the addition of a ground plane 50, provided in the assembly, but insulated from the leadframes. Here ground frame 50 is insulated from leadframes 14b and 16b by insulators 31b and 32b, respectively.

Figure 14:
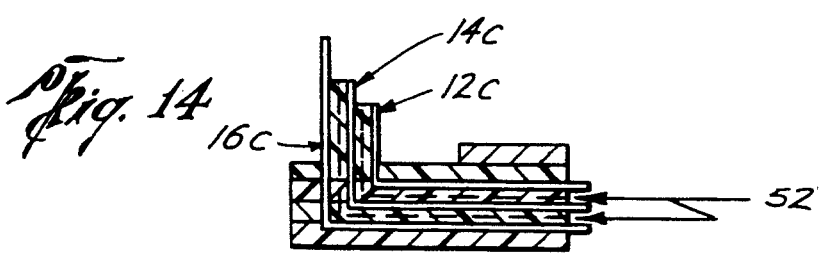
FIG. 14 is a fragmentary, cross-sectional view of an assembled package including multiple reference planes.

Referring to another embodiment shown in FIG. 14, the stacked leadframes 12c, 14c, and 16c are provided with reference planes and/or lines 52 therebetween providing, for example, controlled impedance.

Figure 15:
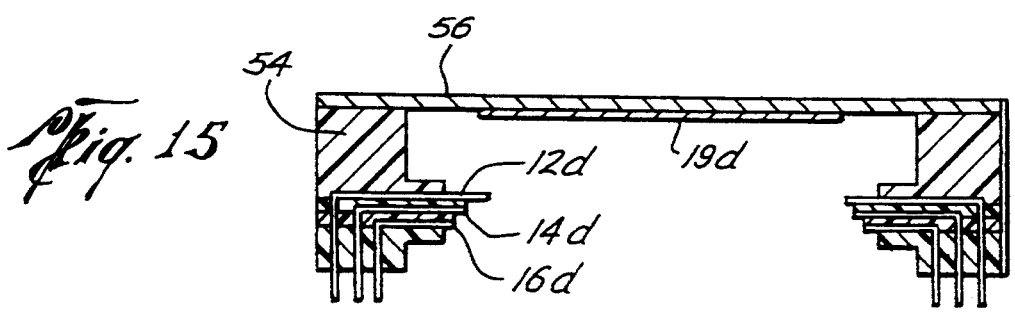
FIG. 15 is a cross-sectional view of one array package with the addition of a heat spreader.

In FIG. 15, the package of FIG. 12 is modified by adding an insulating ring 54 and a metal heat spreader 56, such as copper. In addition, the die paddle 19d is punched out and connected to the heat spreader 56. Thus, when an integrated circuit die is placed on the die paddle 19a, the package of FIG. 15 provides enhanced thermal performance.

Figure 16:
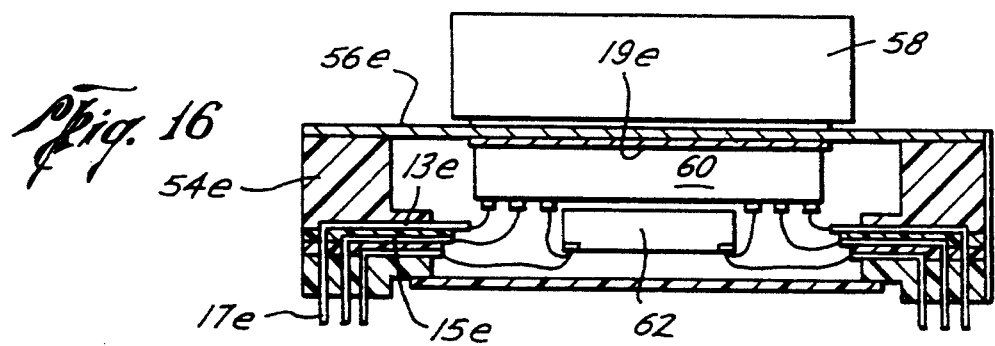
FIG. 16 is a cross-sectional view similar to FIG. 15, but with the addition of other components.

FIG. 16 is a further embodiment wherein additional components have been attached to form a high performance package similar to a PGA. That is, a heat sink 58 has been connected to the heat spreader 56e and an integrated circuit 60 has been attached to the die paddle 19e. A close attached capacitor 62 is placed on the active surface of the integrated circuit 60 and the dc source from outside the package is primarily distributed through the close-attached capacitor 62. Either single row or multiple area pads can be designed on the integrated circuit 60 and the first end of the leads 13e, 15e and 17e are suitably attached to the die 60 or capacitor 62, such as by wire bonding.

Figure 17:
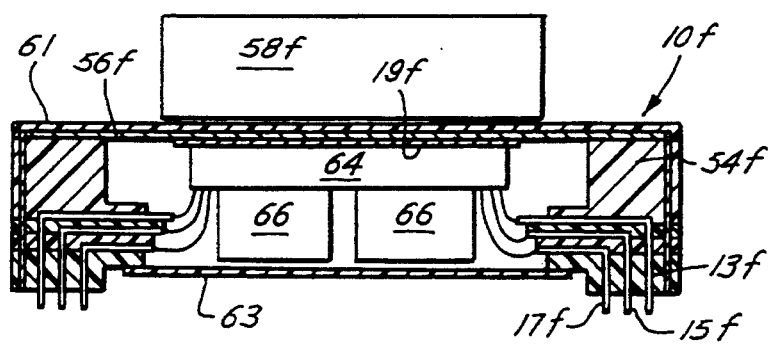
FIG. 17 is a cross-sectional view of an array package having different electrical components.

Referring to FIG. 17, still a further embodiment is shown in which various different components have been added to the package of FIG. 15. In FIG. 17, the package 10f may include an upper plastic coating 61 and a lower plastic coating 63 for providing a protective package. In addition, an interconnect board 64 may be provided for integrated circuit dies 66.

Figure 18:
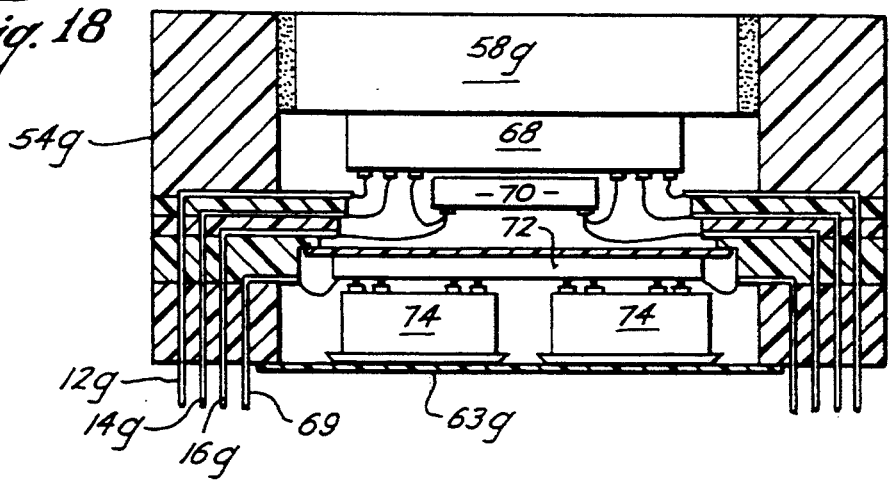
FIG. 18 is a cross-sectional view of a further embodiment of the present invention of different electrical components forming a non-hermetically sealed package.

Referring to FIG. 18, a still more elaborate package can be provided utilizing leadframes 12g, 14g, 16g and 69 having an integrated circuit 68 connected to the heat sink 58g, a close attached capacitor 70, an interconnect board 72, and additional integrated circuit dies 74, all of which are plastically sealed.

Figure 19:
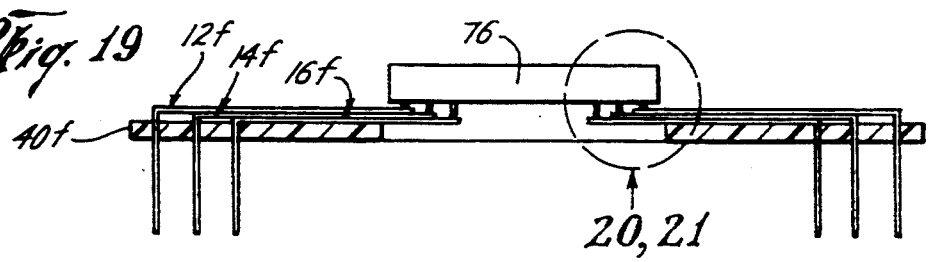
FIG. 19 is a cross-sectional view similar to FIG. 9 with the die paddle removed showing an integrated circuit bonded to the first ends of the leads.
Figure 20:
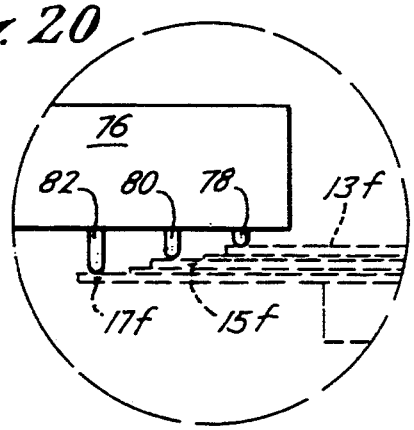
FIG. 20 is an enlarged area at 20 on FIG. 19 showing one method of bonding.
Figure 21:
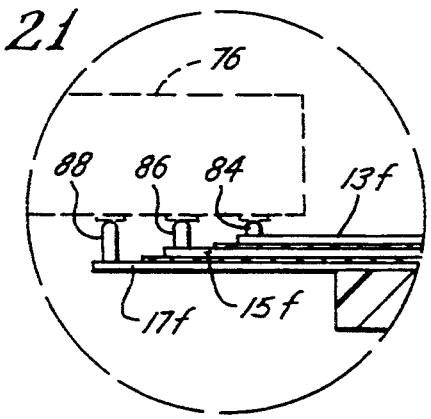
FIG. 21 is an enlarged area at 21 of FIG. 19 showing another method of bonding the chip to the leads.

As previously indicated, the electrical leads of the leadframes may be connected to other electrical components, such as by wire bonding as shown. However, bonding of the leads of the leadframes to integrated circuit chips is not limited to wire bonding, as both TAB and flip-chip bonding can be used. FIGS. 19-21 disclose the use of the prestacked leadframe package of the present invention assembled on a template base with vias placed on the standard flip-chip bump centerline routing the lead fingers to solder pads on an integrated circuit. Thus, in the embodiment, the leadframes 12f, 14f and 16f are bonded to integrated circuit 76. As best seen in FIG. 20, the chip 76 may include successive longer bumps 78, 80 and 82 for bonding to the leads 13f, 15f, and 17f, respectively, of the leadframes 12f, 14f and 16f, respectively. Or as an alternative, as seen in FIG. 21, successively longer bumps 84, 86 and 88 may be applied to the leads 13f, 15f and 17f, respectively.

Figure 22:
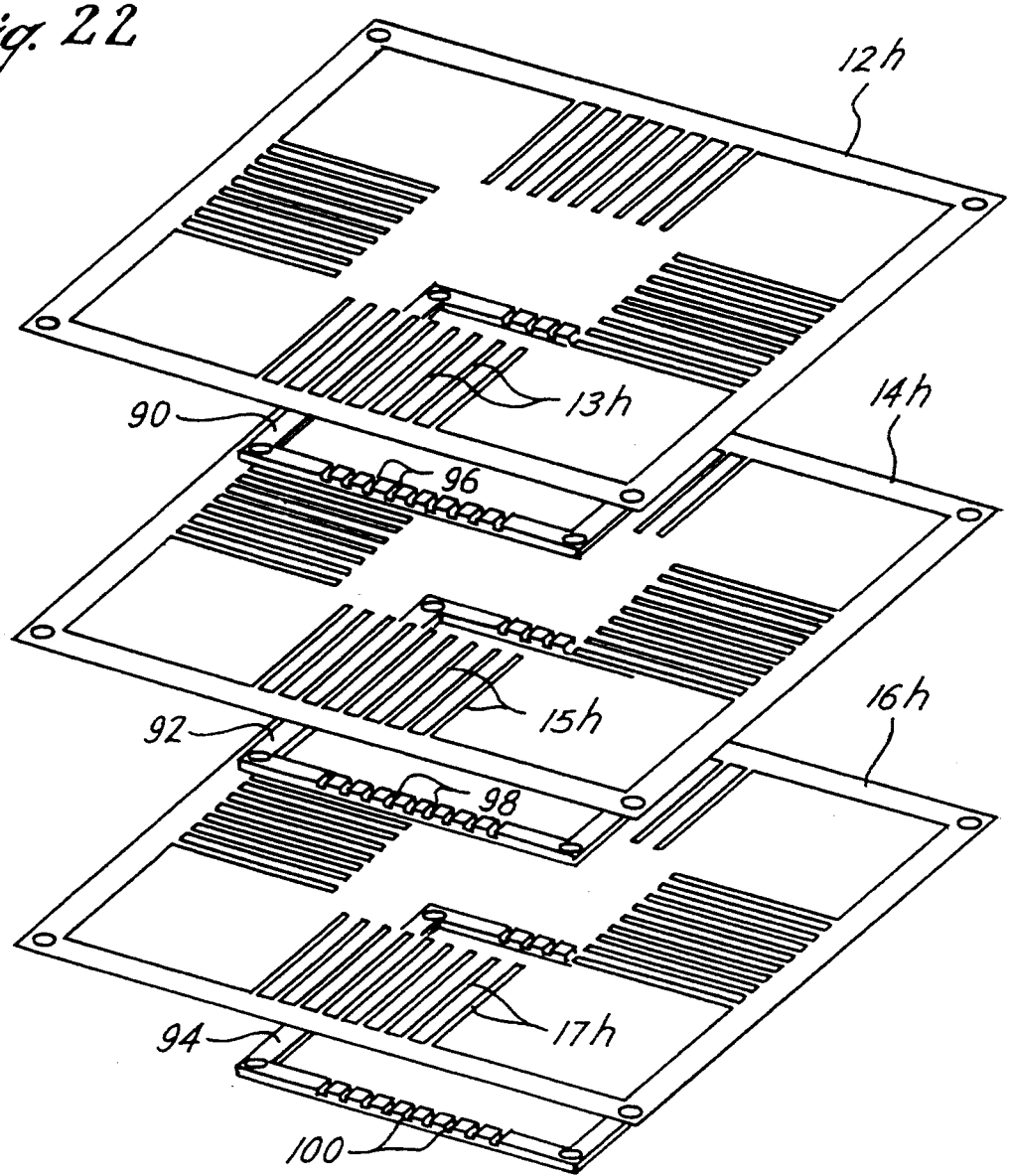
FIG. 22 is an isometric elevational view of an exploded array package comprising leadframes and castellated spacer rings.
Figure 23:
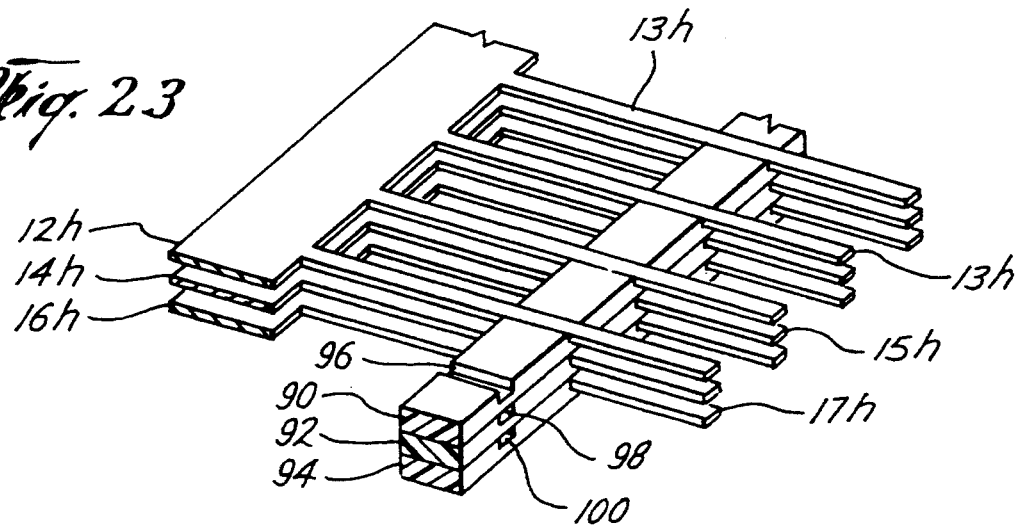
FIG. 23 is an enlarged fragmentary, isometric elevational view of the assembled stack of FIG. 22 showing the electrical leads within the channels of the castellations.

As previously described, the stacked leadframe array package of the present invention can be conveniently assembled by the use of a template 40. Referring now to FIGS. 22 and 23, another method of assembling the leadframe package of the present invention is by the alternate use of leadframes and castellated seal rings which are stacked in layers to form the multilayer leadframe package. In addition, the castellated rings include a plurality of channels that match and each contain one of the electrical leads. Thus, the seal rings 90, 92 and 94 include a plurality of channels 96, 98 and 100, respectively. Thus, the leadframe 16h is placed over the seal ring 94, with the electrical leads 17h each fitting into one of the channels 100. Thereafter, the seal ring 92 is attached, and the leadframe 14h follows with each of its electrical leads 15h fitting into one of the channels 98. After the leadframes and seal rings are assembled, they are then cut and bent.

Figure 24:
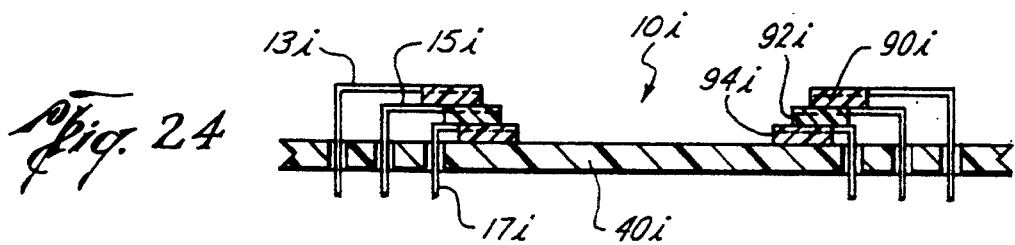
FIG. 24 is a cross-sectional view through the stacked assembly of FIG. 22 after trimming, bending and inserting the leads through a colander base.

A modification is shown in FIG. 24 in which the castellated seal rings 90i, 92i and 94i are of a different size and are positioned to support the first ends of the leads 13i, 15i and 17i for bonding while the second ends are provided extending through a template 40i.

Figure 25:
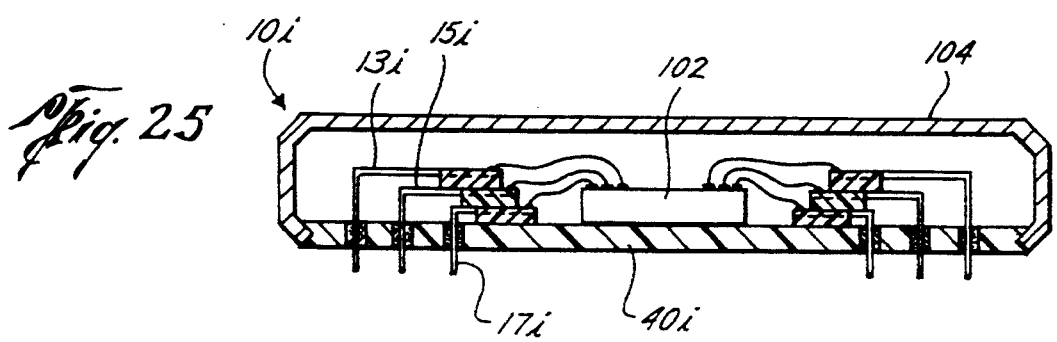
FIG. 25 is a cross-sectional view of the assembly of FIG. 24 with a chip connected to the first ends of the leads and a metal cover enclosing the package forming a hermetic package.

One of the possible disadvantages of the present invention is that the use of a plastic package is a non-hermetic package which may be desirable in some applications. Therefore, referring to FIG. 25, the package 10i of FIG. 24 has been incorporated into a hermetic package in which an electrical component, such as an integrated circuit chip 102, has been electrically connected to the electrical leads 13i, 15i and 17i, the holes in the template base 40i have been hermetically sealed, such as by glass, and a metal cover 104 has been sealably connected to the colander base 40i to provide a hermetically sealed package.

Figure 26:
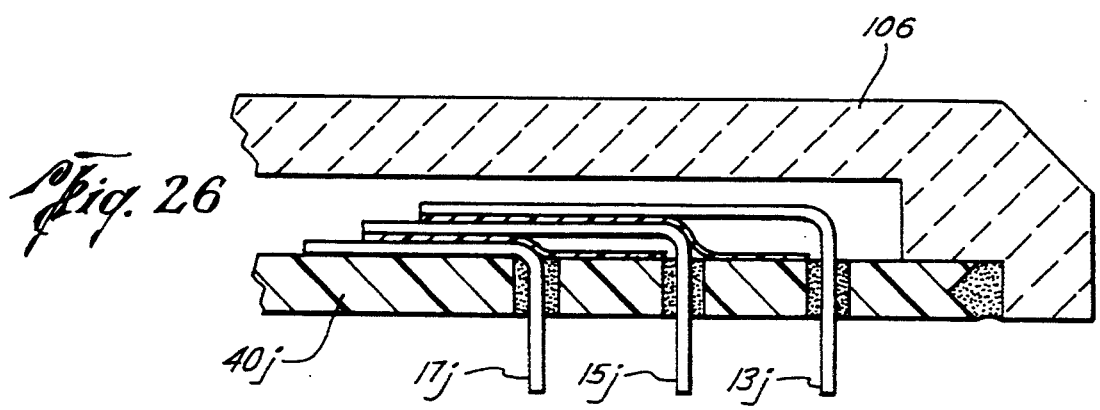
FIG. 26 is an enlarged, fragmentary, cross-sectional view of another embodiment showing a hermetic ceramic covered package.

FIG. 26 represents an alternate assembly having a ceramic cover 106 for forming a hermetic package.

Figure 27:
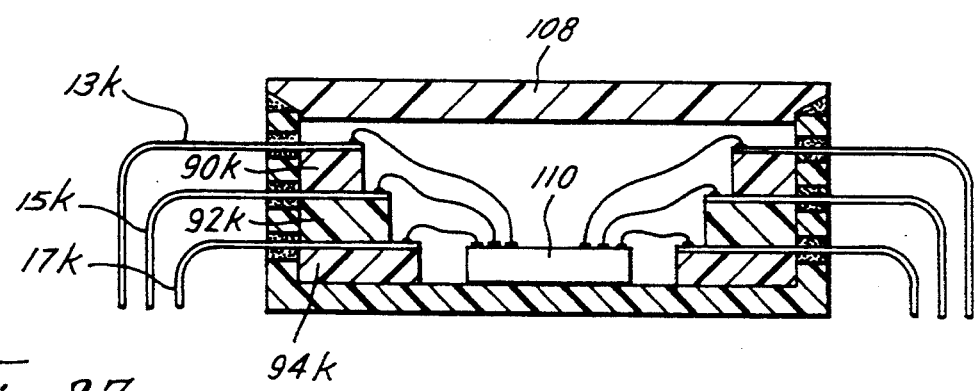
FIG. 27 is a cross-sectional view of still a further array package assembled in a hermetic package.

Still a further embodiment is shown in FIG. 27 in which the castellation rings 90k, 92k and 94k support the first ends of the leads 13k, 15k and 17k, respectively, which extend through and are sealed in a hermetically sealed container 108 which encloses an electrical component 110, such as an integrated circuit die, which is electrically connected to the first ends of each of the electrical leads.

Figure 28:
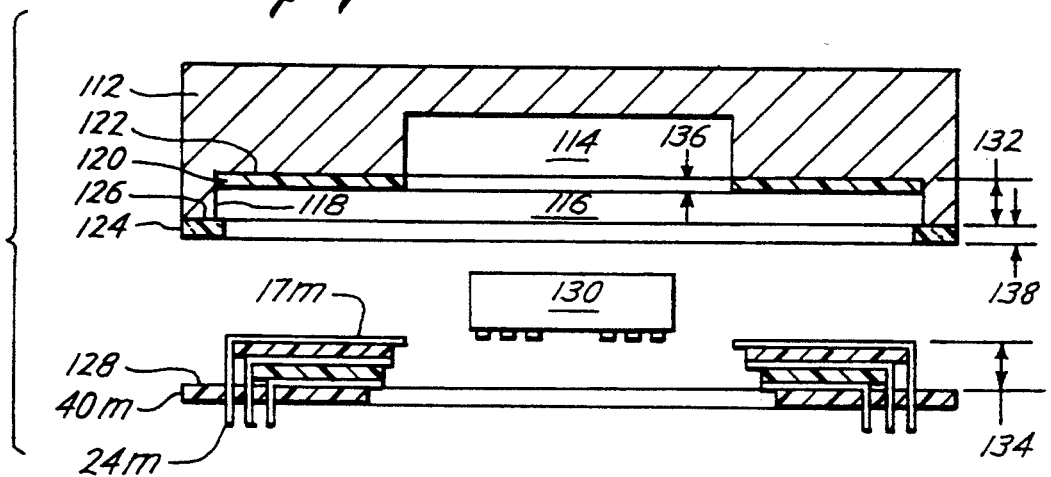
FIG. 28 is a cross-sectional view showing the leadframe package of FIG. 7 with a cavity-down metal base.
Figure 29:
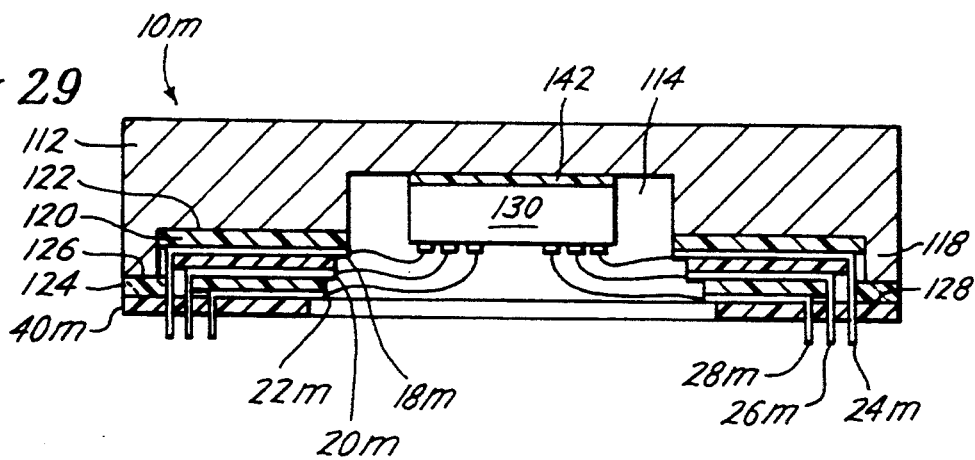
FIG. 29 is a cross-sectional view of the assembly of FIG. 28 with the leadframe package and an integrated circuit chip connected to the metal base.
Figure 30:
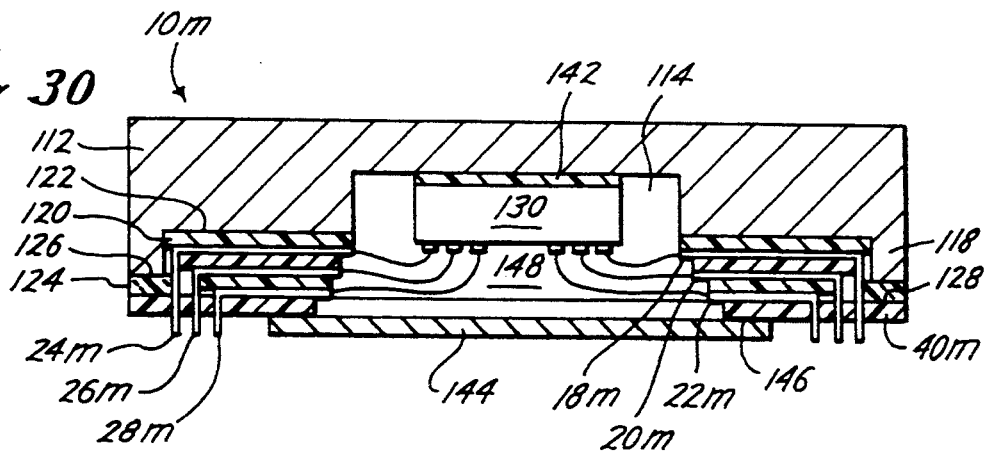
FIG. 30 is a cross-sectional view of the assembly of FIG. 29 with a seal lid connected to the template on the side opposite the metal base.

FIGS. 28–30 describe the assembly of a stacked leadframe and template package with a metal-based cavity-down PGA package. As seen in FIG. 28, an aluminum metal base 112 contains a centrally located cavity 114 formed in a recess 116 surrounded by outer walls 118. Insulator 120 is secured to recess surfaces 122 to prevent leads 17m from being shorted, and glass frit 124 is disposed on outer wall bottoms 126 for sealably connecting the portions 128 on top of template 40m outside second lead ends 24m. Cavity 114 is formed to receive an integrated circuit chip 130, recess 116 is formed to receive leads 17m, and outer walls 118 are formed to align with outer template portions 128. Thus, the height 132 of outer walls 118 preferably is equal to the height 134 of leads 17m above template 40m, plus the height 136 of insulator 120, minus the height 138 of glass frit 124.

In FIG. 29 the chip 130 is secured in cavity 114 by 2 mils of epoxy die attach 142. Likewise, outer portions 128 of template 40m are sealably connected to the bottoms 126 of base walls 118 by glass frit 124. Insulator 120 prevents metal surface 122 from shorting leads 17m. The pads on chip 130 are then wire bonded to first lead ends 18m, 20m and 22m.

In FIG. 30, a seal lid 144 is sealably connected to portions 146 on the bottom of template 40m inside second lead ends 28m. In the preferred sealing operation, a vacuum is applied to draw away any trapped moisture and unwanted gases, the chamber 148 is filled with argon gas in excess of 1 atmosphere, and then lid 144 is sealed to template portions 146 to complete assembly of package 10m.

FIGS. 31–33 illustrate still another method of forming a stacked leadframe package 10n. As seen in FIGS. 31 and 31A, leads 12n, 14n and 16n contain an enlarged standoff 150, 152 and 154, respectively, between first lead ends 18n, 20n, 22n and second lead ends 24n, 26n and 28n, respectively. Furthermore, for ease of connection, during a stamping operation leads 12n, 14n and 16n are roll formed at standoffs 150, 152 and 154, respectively, to second ends 24n, 26n and 28n, respectively. As a result, second lead ends 24n, 26n and 28n are radially bent so that the edges 156 and 158 of the flat lead surfaces 160 are disposed at an angle to one another. Thereafter, the roll formed second ends 24n, 26n and 28n are dipped in solder 162 to form semi-rounded pins.

Referring now to FIG. 32, the next step in the assembly of leadframe package 10n is to insert first ends 22n of leads 17n on lowermost leadframe 16n through template 40n until lead standoffs 154 rest against the bottom surface of template 40n.

In FIG. 33 the assembly continues. Leads 17n are bent to properly position first ends 22n, and insulator 32n is deposited over leads 17n. Thereafter first ends 20n of leads 15n are inserted through the next row of openings 27n in template 40n until lead standoffs 152 contact template 40n, and leads 15n are bent. A similar operation is repeated for insulator 30n and leads 13n of successive leadframe 12n. Standoffs 150, 152 and 154 assure that template 40n shall not contact base 164 which second ends 24n, 26n and 28n are later inserted into. Base 164 can then be heated to reflow solder 162 and bond second ends 24n, 26n and 28n to the vias therein.

The method of making the stacked leadframe array package of the present invention is apparent from the foregoing description.

The present invention, therefore, is well adapted to carry out the objects and attain the ends and advantages mentioned as well as others inherent therein. While presently preferred embodiments of the invention have been given for the purpose of disclosure, numerous changes in the details of construction, arrangement of parts, and steps of the process, will be readily apparent to those skilled in the art and which are encompassed within the spirit of the invention, and the scope of the appended claims.

What is claimed is:

1. A method of making a stacked leadframe array package providing a plurality of electrical input and/or output connections, comprising:

providing at least three leadframes, each leadframe having a plurality of electrical leads having first and second ends for providing a plurality of different connections, the leadframes being identically shaped prior to bending;

inserting the leads into a template having a plurality of spaced openings;

bending the leads between the first and second ends to form horizontal legs between the bends and the first ends, and vertical legs between the bends and the second ends;

positioning the leadframes such that the vertical legs extend through the template, the first ends of adjacent leadframes are vertically spaced, and the second ends of adjacent leadframes are horizontally spaced;

stacking the leadframes by disposing separate insulating layers between horizontal legs of adjacent leadframes;

bonding the stack of leadframes and insulating layers together; then positioning an electronic component adjacent the first ends and connecting the electronic component to the first ends; then sealing the electronic component within the package.

2. The method of claim 1 including, trimming the first ends of the leads so that the first ends of the leads of each successive leadframe layer has a sequentially different length.

3. The method of claim 1 including, placing the second ends of all of the leads of all of the leadframes in a single plane.

4. The method of claim 1 including, before stacking the lead frames bending the leads whereby the first and second ends of each lead are approximately perpendicular to each other.

5. The method of claim 1 including, starting with the lowest leadframe, inserting the second ends through the openings in the template, and continuing to insert the second ends of successive upper layers of leadframes into openings in the template after adding successive insulating layers.

6. The method of claim 5 wherein each leadframe has a die paddle and wherein the stack has first and second ends including, removing all of the die paddles except one at one end of the stack.

7. The method of claim 6 including,
progressively shortening the length of the first ends in successive layers away from the retained die paddle.

8. The method of claim 6 including,
attaching the electrical component to the retained die paddle.

9. The method of claim 8 including,
placing a heat sink against the die paddle on the side opposite the electrical component.

10. The method of claim 6 including,
progressively shortening the length of the first ends in successive layers toward the retained die paddle.

11. The method of claim 1 including,
positioning a ground plane between two adjacent leadframes and insulating said ground plane from the leadframes.

12. The method of claim 1, wherein each insulating layer is a castellated seal ring having a plurality of channels, and further including inserting each of the electrical leads into a separate channel.

13. The method of claim 1 including,
hermetically enclosing the electrical component and first ends.

14. The method of claim 6 including,
removing all the die paddles,
aligning the top of the template with the bottom of the outer walls of a metal base containing a recess within the walls for receiving the leadframes, and
sealably connecting the template to the metal base, thereby enclosing the leadframes in the recess inside the metal base.

15. The method of claim 14 including,
attaching the electronic component inside a centrally located cavity in the recess of the metal base.

16. The method of claim 15 including,
sealably connecting a lid to the bottom of the template and enclosing the electronic component in a sealed chamber.

17. The method of claim 16, wherein the step of sealably connecting the lid includes,
applying a vacuum to the chamber,
filling the chamber with a gas, and then
sealably connecting the lid.

18. The method of claim 2, including
using leadframes with a standoff between the first and second ends of each lead,
starting with the lowermost leadframe, inserting the first ends through the openings in the template until the standoffs contact the bottom of the template, and
continuing to insert the first ends of successive upper layers of leadframes into openings in the template whereby the standoffs of each lead contact the bottom of the template.

19. The method of claim 18 including,
rolling the leads from the standoffs to the second ends.

20. The method of claim 19 including,
dipping the rolled second ends in solder.

21. The method of claim 20 including,
inserting the solder-dipped rolled second ends into a base so that the standoffs contact and separate the base and the template.

22. A method of making a stacked leadframe array package providing a plurality of electrical input and/or output connections, comprising:
providing at least three leadframes, each leadframe having a plurality of electrical leads having first and second ends for providing a plurality of different connections;
inserting the leads into a template having a plurality of spaced openings;
bending the leads between the first and second ends to form horizontal legs between the bends and the first ends, and vertical legs between the bends and the second ends;
positioning the leadframes such that the vertical legs extend through the template, the first ends of adjacent leadframes are vertically spaced, and the second ends of adjacent leadframes are horizontally spaced;
stacking the leadframes by disposing separate insulating layers between horizontal legs of adjacent leadframes;
bonding the stack of leadframes and insulating layers together; then
positioning an electronic component adjacent the first ends and connecting the electronic component to the first ends; then
sealing the electronic component within the package without molding.

23. The method of claim 22 wherein prior to bending the leadframes are identically shaped.

* * * * *